United States Patent
Gupta et al.

(10) Patent No.: US 10,854,264 B2
(45) Date of Patent: Dec. 1, 2020

(54) CURRENT-STARVED DELAY CIRCUITRY

(71) Applicant: Arm Limited, Cambridge (GB)

(72) Inventors: Surya Prakash Gupta, Noida (IN);
Piyush Jain, Noida (IN); El Mehdi Boujamaa, Valbonne (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/293,465

(22) Filed: Mar. 5, 2019

(65) Prior Publication Data

US 2020/0286538 A1    Sep. 10, 2020

(51) Int. Cl.
*G11C 7/00* (2006.01)
*G11C 11/16* (2006.01)

(52) U.S. Cl.
CPC ...... *G11C 11/1693* (2013.01); *G11C 11/1673* (2013.01)

(58) Field of Classification Search
CPC .................. G11C 11/1693; G11C 11/1673
See application file for complete search history.

(56) References Cited

U.S. PATENT DOCUMENTS

| | | | | |
|---|---|---|---|---|
| 7,864,625 B2* | 1/2011 | Carpenter | ............... | G11C 7/22 365/194 |
| 2013/0038350 A1* | 2/2013 | Du | ........................ | H03K 5/133 326/96 |
| 2013/0120047 A1* | 5/2013 | Dally | ................... | H03H 11/265 327/276 |
| 2013/0222026 A1* | 8/2013 | Havens | ................. | H03L 7/0995 327/158 |
| 2013/0342256 A1* | 12/2013 | Wadhwa | .......... | H03K 3/356104 327/277 |
| 2019/0287603 A1* | 9/2019 | Antonyan | ............ | G11C 7/1045 |

* cited by examiner

*Primary Examiner* — Toan K Le
(74) *Attorney, Agent, or Firm* — Pramudji Law Group PLLC; Ari Pramudji

(57) ABSTRACT

Various implementations described herein refer to an integrated circuit having a sense amplifier that operates with a clock signal, and the sense amplifier may be biased with a bias signal that affects duration of the clock signal. The integrated circuit may include a delay circuit coupled to the sense amplifier, and the delay circuit may turn-off the clock signal. The delay circuit may have a current-starved delay stage that receives an input signal having a falling edge and provides a current-starved delay signal biased by the bias signal that also biases the sense amplifier.

20 Claims, 5 Drawing Sheets

CURRENT-STARVED DELAY CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, conventional inverter delay circuits are not typically acceptable for use in generating long duration delay signals due to substantial variation across process and voltage. Additionally, in reference to conventional memory circuitry, a self-timed delay should be nearly insensitive to process and voltage variation, and further, the self-timed delay should also be able to track temperature within acceptable read current parameters. However, the conventional state of self-timed delays is deficient and generally needs improvement.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various schemes and techniques for providing current-starved delay circuitry for adaptively tracking timing behavior of a sense amplifier. The current-starved delay circuitry is configurable to track read current (Iread) in reference to sensing time, and the current-starved delay circuitry is configurable to use a voltage bias signal (e.g., Vbias generates current and is process/voltage independent) to generate a current-starved delay signal. In addition, the current-starved delay circuitry may also be configurable to adaptively track the read current (Iread) in operating conditions related to process, voltage and/or temperature (PVT). In some instances, the read current (Iread) is trimmable.

Various implementations of schemes and techniques for providing current-starved delay circuitry will now be described in detail herein with reference to FIGS. 1-5.

Figure 1:
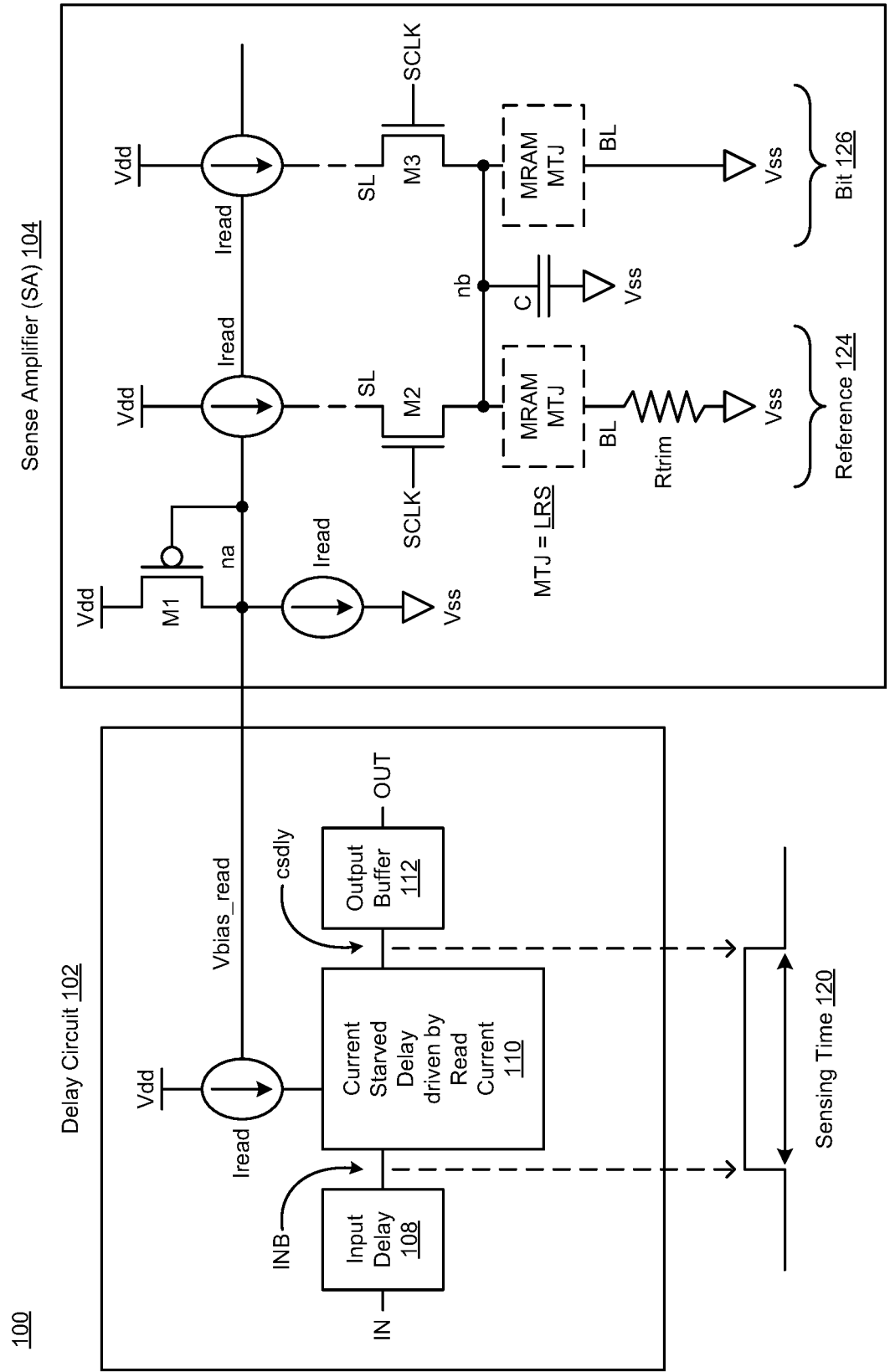
FIG. 1 illustrates a diagram of circuitry having a delay circuit coupled to a sense amplifier in accordance with implementations described herein.

FIG. 1 illustrates a diagram of circuitry 100 having a delay circuit 102 coupled to a sense amplifier (SA) 104 in accordance with implementations described herein.

As shown in FIG. 1, the sense amplifier 104 operates with a clock signal (SCLK), and the sense amplifier 104 is biased with a bias signal, such as, e.g., a voltage bias signal (Vbias_read), that affects duration of the clock signal (SCLK), which may be referred to as a read clock signal or a sense clock signal. The voltage bias signal (Vbias) may also be used to drive the sense amplifier 104, which may have a timing characteristic that is met by the delay circuit 102. In some instances, the delay circuit 102 may be used as a tracked delay generator. In some implementations, the voltage bias signal (Vbias_read) controls the current (Iread) through the sense amplifier (SA) 104. Also, the read clock signal (SCLK) may refer to a sense clock signal during a read operation. The sense amplifier 104 may include a first transistor (M1) coupled between a voltage supply (Vdd) and a Vbias_read line at node (na), and also, a gate of the first transistor (M1) is coupled to the Vbias_read line at node (na). In some instances, the first transistor (M1) may include a p-type metal-oxide-semiconductor (PMOS) transistor. However, in other instances, the first transistor (M1) may include an n-type MOS (NMOS) transistor.

The sense amplifier 104 may include a second transistor (M2) and a third transistor (M3) coupled between the Vbias_read line and MRAM MTJ bits via sense lines (SL) and bitlines (BL). In some instances, the sense amplifier 104 may be used in memory circuitry that includes magneto-resistive random access memory (MRAM) having magnetic tunneling junctions (MTJ). The MRAM MTJ bits may be coupled between the transistors (M2, M3) and another voltage supply (Vss or Gnd) via bitlines (BL). Also, a capacitor (C) may be coupled between the transistors (M2, M3) at node (nb) and the second supply (Vss), which may refer to ground (Gnd). The combination of source lines (SL) and bitlines (BL) provide for a reference portion (or leg) 124 and a bit portion (or leg) 126. The reference portion (or leg) 124 includes the second transistor (M2), a reference MRAM MTJ bit (in a low resistive state LRS), and a trim resistor (Rtrim) that are coupled between the voltage supply (Vdd) at the Vbias-read line and the other voltage supply (Vss). The bit portion (or leg) 126 includes the third transistor (M3) and a data MRAM MTJ bit that are coupled between the voltage supply (Vdd) at the Vbias-read line and the other voltage supply (Vss).

In some implementations, the read clock signal (SCLK) may be applied to gates of the second and third transistors (M2, M3). As such, the read clock signal (SCLK) may be used to activate the second and third transistors (M2, M3) so as to allow the read current (Iread) to pass through the second and third transistors (M2, M3) from the Vbias read line to the MRAM MTJ bits. In some instances, the first pass transistor (M1) assists with mirroring the read current (Iread) in the the sense amplifier 104. The MRAM MTJ refers to a magneto-resistive tunneling junction for a single bit. The reference portion (or leg) 124 provides for the reference MRAM MTJ bit in a low resistive state (LRS), and the trim resistor (Rtrim) refers to a reference level adjustment for the low resistive state. Also, the reference portion (or leg) 124 refers to the LRS plus the Rtrim, and the bit portion (or leg) 126 stores data.

As shown in FIG. 1, the delay circuit 102 may be coupled to the sense amplifier 104, and the delay circuit 102 may be configured to turn-off the clock signal (SCLK). This concept is shown in greater detail in FIG. 3. Also, the delay circuit 102 may have a current-starved delay stage 110 that receives an input signal (e.g., INB) having a falling edge and that provides a current-starved delay signal (e.g., csdly) biased by the bias signal, such as, e.g., the voltage bias signal (Vbias_read), that also biases the sense amplifier (SA) 104. The delay circuit 102 is coupled to the sense amplifier 104 such that the delay circuit 102 includes an input stage 108 (or input delay stage) that receives a first signal (IN) and then provides a second signal (INB) as the input signal (INB) to the current-starved delay stage 110.

In some implementations, the voltage bias signal (Vbias_read) drives the sense amplifier (SA) 104, and the sense amplifier 104 has a timing characteristic that is met by the delay circuit 102. In some instances, the read current (Iread) passes through the transistors (M2, M3) when activated, and also, the read current (Iread) drives the MRAM MTJ bits via the source lines (SL) and the bitlines (BL).

The delay circuit 102 may be referred to as a tracked delay generator. The delay circuit 102 includes the input stage 108 (or input delay stage) which is coupled to the current-starved delay stage 110, and the input stage 108 provides the input signal (INB) as a first inversion signal with the falling edge. The input stage 108 receives the first signal (IN) with a rising edge, and the delay circuit 102 starts upon receiving the input signal (INB) with the falling edge. In this instance, the sense amplifier 104 also starts when the delay circuit 102 receives the input signal (INB) with the falling edge. This concept is shown and described in more detail in reference to FIG. 4.

The delay circuit 102 includes an output buffer 112 (or output buffer stage) that is coupled to the current-starved delay stage 110, and the output buffer 112 (or output buffer stage) is arranged to receive the current-starved delay signal (csdly) from the current-starved delay stage 110 and provide a delayed current-starved delay signal as an output signal (OUT). In this instance, the output buffer 112 (or output buffer stage) may provide the output signal (OUT) with a rising edge, and operation of the sense amplifier (SA) 104 may terminate with the rising edge of the output signal (OUT).

In some instances, the read current (Iread) is provided to the current-starved delay stage 110 from the Vbias read line. Also, the current-starved delay stage 110 receives the input signal (INB) and provides the current-starved delay signal (csdly) based on a sensing time 120. In this instance, the sensing time 120 has a duration that starts with a rising edge when the input signal (INB) is provided to the current-starved delay stage 110 and ends with a falling edge at the output (csdly) of the current-starved delay stage 110.

The various schemes and techniques described herein provide for current-starved delay circuitry that adaptively tracks timing behavior of a sense amplifier. For instance, the current-starved delay circuitry 102 is configured to track the read current (Iread) in reference to sensing time 120, and the voltage bias signal Vbias (generates current which is PN independent) is used to generate the current starved delay (csdly). The current-starved delay circuitry 102 adaptively tracks read current (Iread) in some operating conditions, such as, e.g., process/voltage/temperature (PVT), and the read current (Iread) is also trimmable.

The circuitry 100 and the various components thereof may be fabricated and/or implemented as an integrated circuit (IC), and as such, the circuitry 100 may be integrated with various types of logic circuitry and related components on a single chip. The circuitry 100 may be implemented in embedded systems for various types of electronic, mobile, biometric, and/or various Internet-of-Things (IoT) applications.

Figure 2:
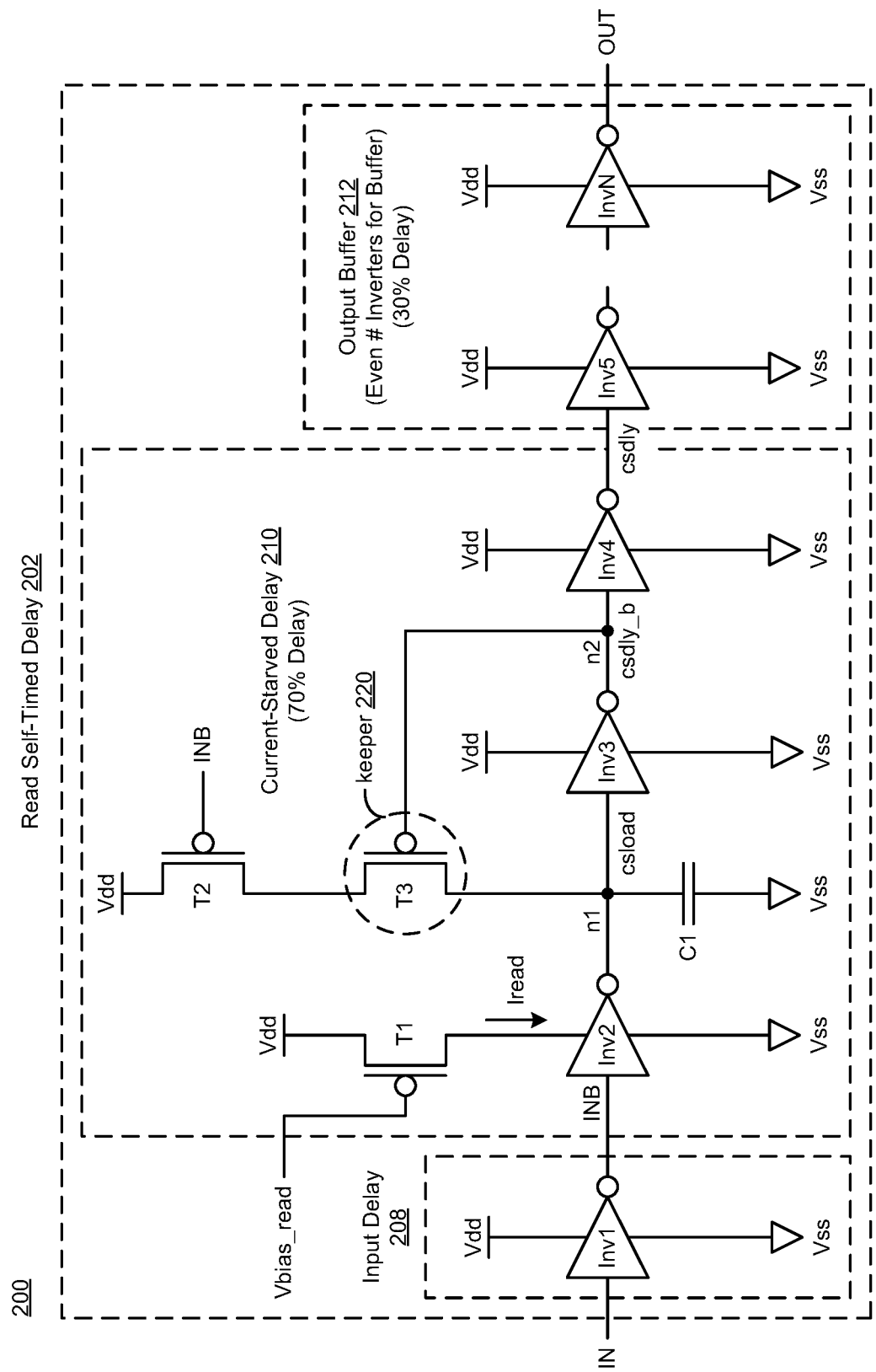
FIG. 2 illustrates a diagram of circuitry having an input delay, a current-starved delay and an output buffer in accordance with implementations described herein.

FIG. 2 illustrates a diagram of circuitry 200 having an input delay stage 208, a current-starved delay stage 210, and an output buffer stage 212 in accordance with various implementations described herein. In some implementations, the circuitry 200 may refer to a read self-timed delay circuit 202 having the multiple stages 208, 210, 212 that are coupled together and arranged to operate in a manner as described herein. Thus, the read self-timed delay circuit 202 includes the input delay stage 208, the current-starved delay stage 210, and the output buffer stage 212 arranged in series to receive an input signal (IN) and provide a delayed current-starved delay signal as an output signal (OUT).

As shown in FIG. 2, the input stage 208 may receive input signal (IN) and provide a first inversion signal (INB) having a falling edge. The input stage 208 may operate as an input delay circuit with a first inverter (Inv1) that receives the input signal (IN) and provides the first inversion signal (INB) to the current-starved delay stage 210. The first inverter (Inv1) may be referred to as an input inverter.

The current-starved delay stage 210 may receive the first inversion signal (INB) from the input stage 208 and provide a current-starved delay signal (csdly) biased by the voltage bias signal (Vbias_read) that also biases the sense amplifier 104 (e.g., as shown in FIG. 1). The current-starved delay stage 210 may provide the current-starved delay signal (csdly) with multiple inverters (Inv2, Inv3, Inv4) that are coupled in series as an inverter delay chain. Also, the multiple inverters (Inv2, Inv3, Inv4) may include a second inverter (Inv2) that receives the first inversion signal (INB) from the first inverter (Inv1), receives a first supply voltage (Vdd) via a first pass transistor (T1), generates a second inversion signal (csload) based on the first supply voltage (Vdd), and provides the second inversion signal (csload) to a first node (n1). The multiple inverters (Inv2, Inv3, Inv4) of the current-starved delay stage 210 may include a third inverter (Inv3) that receives the second inversion signal (csload) from the second inverter (Inv2) via the first node (n1), generates a third inversion signal (csdly_b) based on the second inversion signal (csload), and provides the third inversion signal (csdly_b) to a second node (n2). Also, the multiple inverters (Inv2, Inv3, Inv4) of the current-starved delay stage 210 may include a fourth inverter (Inv4) that receives the third inversion signal (csdly_b) from the third inverter (Inv3) via the second node (n2), generates a fourth inversion signal (csdly) based on the third inversion signal (csdly_b), and provides the fourth inversion signal (csdly) as the current-starved delay signal (csdly) to the output buffer 212.

The first pass transistor (T1) may be coupled between the first supply voltage (Vdd) and a power supply connection of the second inverter (Inv2). The first pass transistor (T1) may be activated with the voltage bias signal (Vbias_read), and the first pass transistor (T1) may provide the first supply voltage ($\leq$Vdd) to the power supply connection of the second inverter (Inv2) when activated. In some instances, the first pass transistor (T1) may be a PMOS transistor. However, the first pass transistor (T1) may be an NMOS transistor.

The current-starved delay stage 210 may include a second pass transistor (T2), a third pass transistor (T3), and a capacitor (C1) coupled in series between the first supply voltage (Vdd) and the second supply voltage (Vss), which may refer to ground (Gnd). The second pass transistor (T2) may be coupled between the first supply voltage (Vdd) and the third pass transistor (T3), and the second pass transistor (T2) may be activated based on the first inversion signal (INB) from the first inverter (T1). The third pass transistor (T3) may be coupled between the second pass transistor (T2) and the capacitor (C1) at the first node (n1), which is disposed between the second inverter (Inv2) and the third inverter (Inv3). The third pass transistor (T3) may operate as a keeper transistor 220 that is activated by the third inversion signal (csdly_b) as a feedback signal from the third inverter (Inv3) via the second node (n2). The capacitor (C1) may be coupled between the third pass transistor (T3) at the first node (n1) and the second supply voltage (Vss). In some instances, the second pass transistor (T2) and the third pass transistor (T3) may be PMOS transistors. However, in other instances, the second pass transistor (T2) and the third pass transistor (T3) may be NMOS transistors.

The output buffer stage 212 may have multiple inverters (Inv5, . . . , InvN) that are coupled in series as an inverter buffer chain. The multiple inverters (Inv5, . . . , InvN) may be arranged to receive the current-starved delay signal (csdly) from the current-starved delay stage 210 and provide a delayed current-starved delay signal as output signal (OUT). The multiple inverters (Inv5, . . . , InvN) of the output buffer stage 212 may include an even number (N) of inverters that are arranged to receive the current-starved delay signal (csdly) from the current-starved delay stage 210 and provide the delayed current-starved delay signal (OUT) as the output signal (OUT).

Also, as shown in FIG. 2, the third pass transistor T3 may operate as a keeper transistor that is used to pre-charge the csload node (n1) to Vdd when the csdly node (n2) falls, which may result in saving crow-bar power when the slope of csload is low. In some instances, voltage supply to the system (memory macro) may increase which may cause the current starved delay 210 delay to increase (which may refer to opposite behavior with respect to supply increase due to a trip point increase of Inv3 and current is unchanged with supply increase), and to counter the increased delay, some proportion of total delay may be modified with an inverter delay to balance the delay trend across the entire read self-timed delay circuit 202. In some instances, the contribution of the current-starved delay 210 and the output buffer delay 212 may be ~70% and ~30%, respectively. I.e., the current-starved delay 210 may contribute approximately 70% of the total delay to the read self-timed delay circuit 202, and the output buffer delay 212 may contribute approximately 30% of the total delay to the read self-timed delay circuit 202. Also, a jammed latch formation with the rising of the input signal (INB) may be avoided by stacking the keeper PMOS (T3) with another switch (e.g., pass transistor T2) that is activated with the input signal INB.

As described herein, the voltage bias signal (Vbias_read) may be used to control the read current (Iread) through the sense amplifier (SA) 104, and also, the read clock signal (SCLK) may refer to a sense clock signal during a read operation. The Inv2 in FIG. 2 may refer to a current-starved inverter, which is current-starved by Vbias_read having a controlled current (Iread) that is limited by the pass transistor T1, wherein Vdrain<=Vdd. The output buffer stage 212 may be used to compensate for process variation in the delay circuit 202 that is caused by the current source (Iread) and also for supply voltage variation in the delay circuit 202 that is caused by trip point variation of the sensing inverter (Inv3) with supply voltage. The second pass transistor (T2) removes the contention between T3 and an NMOS of Inv2, wherein when INB rises, Inv2 turns-off to remove the contention between T3 and the NMOS of Inv2. Also, T3 reduces the crow-bar current flowing through Inv3 for the duration of the sensing time 120 when csload node pre-charges slowly with the Iread current, so as to charge C1 slowly. This may occur when the level of csload is intermediate (e.g., ramps input for Inv3), so there will be a direct current through Inv3. In addition, the keeper structure of T3 may avoid a long duration of the crowbar current through Inv3.

The circuitry 200 and the various components thereof may be fabricated and implemented as an integrated circuit (IC), and as such, the circuitry 200 may be integrated with various types of logic circuitry and related components on a single chip. The circuitry 200 may be implemented in embedded systems for various types of electronic, mobile, biometric, and/or various Internet-of-Things (IoT) applications.

Figure 3:
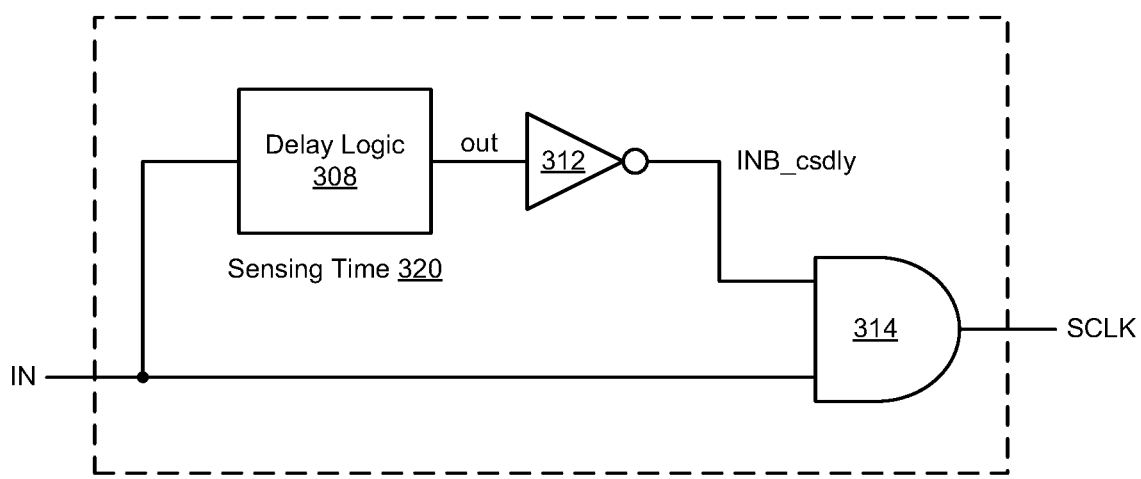
FIG. 3 illustrates a diagram of logic circuitry for generating a read clock (SCLK) in accordance with implementations described herein.

FIG. 3 illustrates a diagram 300 of logic circuitry 302 for generating the read clock (SCLK) in accordance with implementations described herein. The logic circuitry 302 may include various logic circuits, gates, and/or other similar components. The diagram 330 of FIG. 3 represents an implementation of the logic circuitry 302. In other implementations, the logic circuitry 302 may include any number and type of logic circuits, gates, and/or other similar components that are arranged to perform in a similar manner.

In some instances, the logic circuitry 302 refers to a timing circuit that incorporates the current starved delay (INB_csdy) that may be used to turn-on and turn-off the sense amplifier clock (SCLK), which may also be referred to as the read clock signal. As shown in FIG. 3, the logic circuitry 302 may include various logic circuits, such as, e.g., delay logic 308, an inverter 312, and an AND gate 314, that are arranged to receive the input signal (IN) and provide the read clock signal (SCLK). The delay logic 308 may be coupled to the inverter 312, and the delay logic 308 may receive the input signal (IN) and provide an intermediate output signal (out) to the inverter 312. Also, the inverter 312 may be coupled between the delay logic 308 and a first input of the AND gate 314, and the inverter 312 may receive the intermediate output signal (out) from the delay logic 308 and provide a delayed input signal (INB_csdly) to the first input of the AND gate 314.

The AND gate 314 may receive the delayed input signal (INB_csdly) at the first input, and the AND gate 314 may also receive the input signal (IN) at a second input. Also, the AND gate 314 may provide the read clock signal (SCLK) based on the delayed input signal (INB_csdly) and the input signal (IN).

Figure 4:
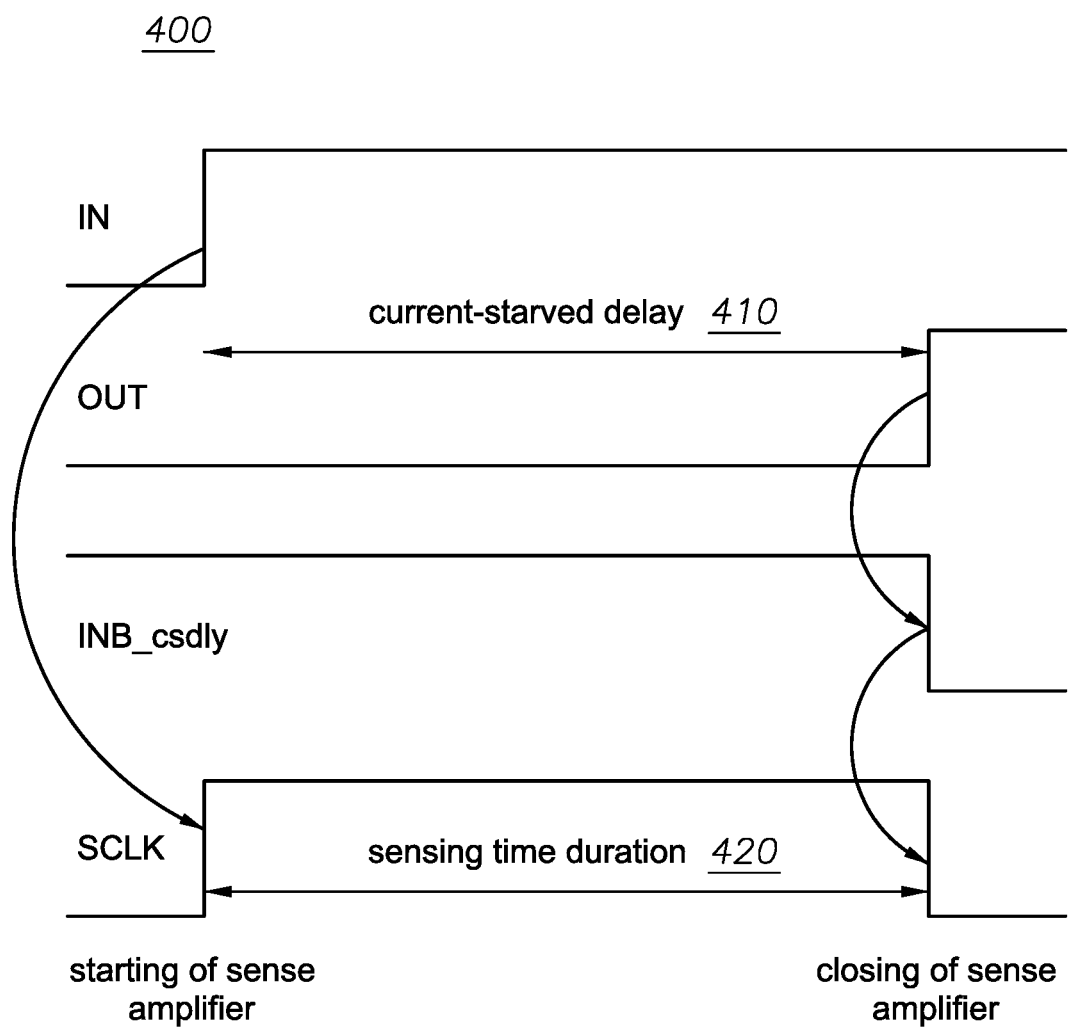
FIG. 4 illustrates a timing diagram of various waveforms related to operation of logic circuitry in accordance with implementations described herein.

FIG. 4 illustrates a timing diagram 400 of various waveforms related to operation of the logic circuitry 302 in accordance with implementations described herein. As shown in FIG. 4, the input signal (IN) has a rising edge that matches a rising edge of the read clock signal (SCLK). The output signal (OUT) has a rising edge that is delayed by the current-starved delay 410. Also, the rising edge of the output signal (OUT) matches the falling edge of the delayed input signal (INB_csdly) and the falling edge of the read clock signal (SCLK). Further, the sensing time duration 420 may be measured between the rising edge of the read clock signal (SCLK) and the falling edge of the read clock signal (SCLK). As such, in some implementations, the rising edge of the read clock signal (SCLK) may refer to starting of the sense amplifier 104, and the falling edge of the read clock signal (SCLK) may refer to closing of the sense amplifier 104.

Figure 5:
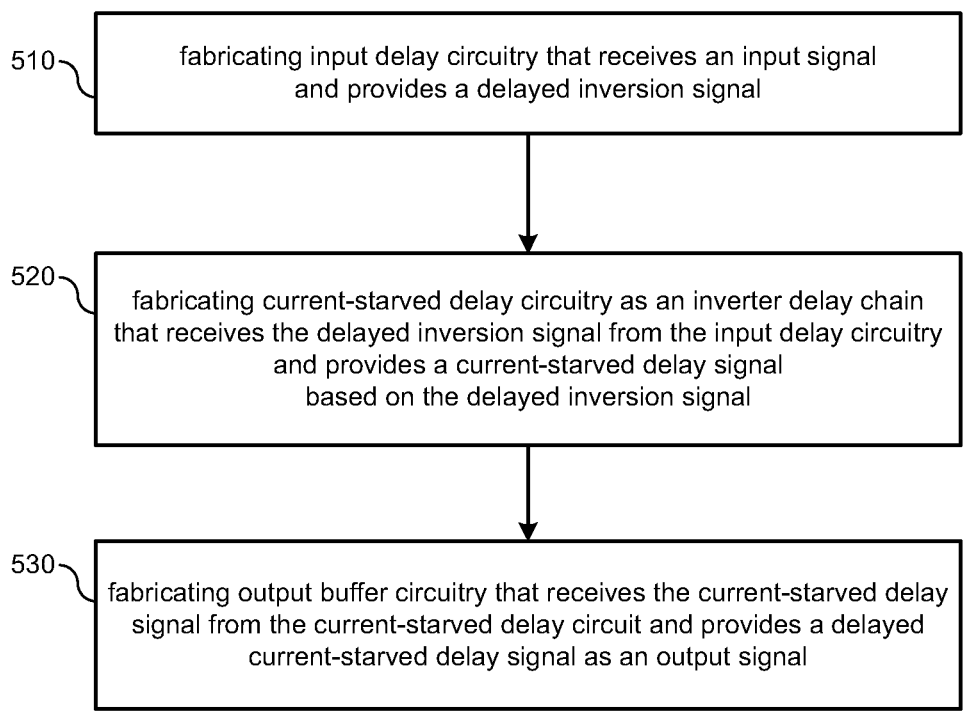
FIG. 5 illustrates a process flow diagram of a method for providing a current-starved delay in accordance with implementations described herein.

FIG. 5 illustrates a process flow diagram of a method 500 for providing a current-starved delay in accordance with various implementations described herein.

It should be understood that even though method 500 indicates a particular order of operation execution, in some cases, various certain portions of the operations may be executed in a different order, and on different systems. In other cases, additional operations and/or steps may be added to and/or omitted from method 500. Also, method 500 may be implemented in hardware and/or software. If implemented in hardware, method 500 may be implemented with various components and/or circuitry, as described herein in reference to FIGS. 1-4. Also, if implemented in software, method 500 may be implemented as a program or software instruction process that is configured for providing various schemes and techniques, as described herein. Further, if implemented in software, instructions related to implementing the method 500 may be stored in memory and/or a database. For instance, a computer or various other types of computing devices having a processor and memory may be configured to perform method 500.

As described and shown herein in reference to FIG. 5, method 500 may be used for fabricating and/or manufacturing, or causing to be fabricated and/or manufactured, an integrated circuit (IC) that implements various schemes and techniques that are related to providing current-starved delay circuitry and/or various circuitry related thereto.

At block 510, method 500 may fabricate input delay circuitry that receives an input signal and provides a delayed inversion signal. The input delay circuitry has an input inverter that receives the input signal and provides the delayed inversion signal.

At block 520, method 500 may fabricate current-starved delay circuitry as an inverter delay chain that receives the delayed inversion signal from the input delay circuitry and provides a current-starved delay signal based on the delayed inversion signal. The inverter delay chain refers to a first inverter delay chain that is coupled to the input inverter, and the first inverter delay chain receives the delayed inversion signal from the input inverter and provides the current-starved delay signal.

The first inverter delay chain may include a first inverter that receives the delayed inversion signal from the input inverter as a first inversion signal, receives a first supply voltage (e.g., <=Vdd) via a first pass transistor, generates a second inversion signal based on the first supply voltage, and provides the second inversion signal to a first node. Also, the first pass transistor may be coupled between the first supply voltage and a power supply connection of the first inverter, and the first pass transistor may be activated with a voltage bias signal. The first pass transistor may also provide the first supply voltage to the power supply connection of the first inverter when activated.

The first inverter delay chain includes a second inverter that receives the second inversion signal from the first inverter via the first node, generates a third inversion signal based on the second inversion signal, and provides the third inversion signal to a second node. The first inverter delay chain includes a third inverter that receives the third inversion signal from the second inverter via the second node, generates a fourth inversion signal based on the third inversion signal, and provides the fourth inversion signal as the current-starved delay signal to the output delay circuit.

The current-starved delay circuitry also includes a second pass transistor, a third pass transistor, and a capacitor that are coupled in series between the first supply voltage (e.g., Vdd) and a second supply voltage (e.g., a ground voltage Vss or Gnd). The second pass transistor may be coupled between the first supply voltage and the third pass transistor, and the second pass transistor may be activated based on the delayed inversion signal from the input inverter. Also, the third pass transistor may be coupled between the second pass transistor and the capacitor at the first node which is disposed between the first inverter and the second inverter. In some instances, the third pass transistor may operate as a keeper transistor that is activated by the third inversion signal as a feedback signal from the second inverter via the second node, and the capacitor may be coupled between the third pass transistor at the first node and the second supply voltage (e.g., Vss or Gnd).

At block 530, method 500 may fabricate output buffer circuitry that receives the current-starved delay signal from the current-starved delay circuit and provides a delayed current-starved delay signal as an output signal. The output delay circuitry has a second inverter delay chain arranged to operate as an output buffer that receives the current-starved delay signal from the first inverter delay chain and provides the delayed current-starved delay signal as an output signal. The second inverter delay chain may include an even number of inverters that are arranged to operate as an output buffer which receives the current-starved delay signal from the current-starved delay circuit and provides the delayed current-starved delay signal as the output signal.

Described herein are various implementations of an integrated circuit. The integrated circuit may include a sense amplifier that operates with a clock signal, and the sense amplifier may be biased with a bias signal that affects duration of the clock signal. The integrated circuit may include a delay circuit coupled to the sense amplifier, and the delay circuit may turn-off the clock signal. The delay circuit may have a current-starved delay stage that receives an input signal having a falling edge and provides a current-starved delay signal biased by the bias signal that also biases the sense amplifier.

Described herein are various implementations of an integrated circuit. The integrated circuit may include an input delay circuit having an input inverter that receives an input signal and provides a delayed inversion signal. The integrated circuit may include a current-starved delay circuit having a first inverter delay chain coupled to the input inverter, and the first inverter delay chain receives the delayed inversion signal from the input inverter and provides a current-starved delay signal. The integrated circuit may include an output delay circuit having a second inverter delay chain arranged to operate as an output buffer that receives the current-starved delay signal from the first inverter delay chain and provides a delayed current-starved delay signal as an output signal.

Described herein are various implementations of a method. The method may include fabricating input delay circuitry that receives an input signal and provides a delayed inversion signal. The method may include fabricating current-starved delay circuitry as an inverter delay chain that receives the delayed inversion signal from the input delay circuitry and provides a current-starved delay signal based on the delayed inversion signal. The method may include fabricating output buffer circuitry that receives the current-starved delay signal from the current-starved delay circuit and provides a delayed current-starved delay signal as an output signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should also be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a sense amplifier that operates with a clock signal, wherein the sense amplifier is biased with a bias signal that affects duration of the clock signal; and
   a delay circuit coupled to the sense amplifier, wherein the delay circuit turns-off the clock signal, and wherein the delay circuit has a current-starved delay stage that receives an input signal having a falling edge and provides a current-starved delay signal biased by the bias signal that also biases the sense amplifier.

2. The integrated circuit of claim 1, wherein the delay circuit further includes an input stage coupled to the current-starved delay stage, and wherein the input stage provides the input signal as a first inversion signal with the falling edge.

3. The integrated circuit of claim 2, wherein the input stage receives the input signal with a rising edge, wherein the delay circuit starts upon receiving the input signal with the falling edge, and wherein the sense amplifier also starts when the delay circuit receives the input signal with the falling edge.

4. The integrated circuit of claim 2, wherein the input stage provides an input delay circuit with a first inverter that receives the input signal with the rising edge and provides the input signal with the falling edge as the first inversion signal to the current-starved delay stage.

5. The integrated circuit of claim 4, wherein the current-starved delay stage provides the current-starved delay signal with multiple inverters coupled in series as an inverter delay chain, wherein the multiple inverters include a second inverter that receives the first inversion signal from the first inverter, receives a first supply voltage via a first pass transistor, generates a second inversion signal based on the first supply voltage, and provides the second inversion signal to a first node.

6. The integrated circuit of claim 5, wherein the first pass transistor is coupled between the first supply voltage and a power supply connection of the second inverter, wherein the first pass transistor is activated with the bias signal, and wherein the first pass transistor provides the first supply voltage to the power supply connection of the second inverter when activated by the bias signal.

7. The integrated circuit of claim 5, wherein the multiple inverters of the current-starved delay stage include a third inverter that receives the second inversion signal from the second inverter via the first node, generates a third inversion signal based on the second inversion signal, and provides the third inversion signal to a second node.

8. The integrated circuit of claim 7, further comprising:
   a second pass transistor, a third pass transistor, and a capacitor coupled in series between the first supply voltage and a second supply voltage,
   wherein the second pass transistor is coupled between the first supply voltage and the third pass transistor, and wherein the second pass transistor is activated based on the first inversion signal from the first inverter,
   wherein the third pass transistor is coupled between the second pass transistor and the capacitor at the first node which is disposed between the second inverter and the third inverter, and wherein the third pass transistor operates as a keeper transistor that is activated by the third inversion signal as a feedback signal from the third inverter via the second node, and wherein the capacitor is coupled between the third pass transistor at the first node and the second supply voltage.

9. The integrated circuit of claim 8, wherein the first pass transistor, the second pass transistor, and the third pass transistor are p-type transistors.

10. The integrated circuit of claim 7, wherein the multiple inverters of the current-starved delay stage include a fourth inverter that receives the third inversion signal from the third inverter via the second node, generates a fourth inversion signal based on the third inversion signal, and provides the fourth inversion signal as the current-starved delay signal.

11. The integrated circuit of claim 1, wherein the delay circuit further includes an output buffer stage coupled to the current-starved delay stage, and wherein the output buffer stage is arranged to receive the current-starved delay signal from the current-starved delay stage and provide a delayed current-starved delay signal as an output signal.

12. The integrated circuit of claim 11, wherein the output buffer stage provides the output signal with a rising edge, and wherein operation of the sense amplifier terminates with the rising edge of the output signal.

13. The integrated circuit of claim 11, wherein the output buffer stage has multiple inverters coupled in series as an inverter buffer chain, and wherein the multiple inverters of the output buffer stage include an even number of inverters that are arranged to receive the current-starved delay signal from the current-starved delay stage and provide the delayed current-starved delay signal as the output signal.

14. The integrated circuit of claim 1, wherein the bias signal comprises a voltage bias signal, wherein the voltage bias signal drives the sense amplifier, and wherein the sense amplifier has a timing characteristic that is met by the delay circuit.

15. An integrated circuit, comprising:
a sense amplifier configured to operate with a clock signal;
an input delay circuit having an input inverter that receives an input signal and provides a delayed inversion signal;
a current-starved delay circuit having a first inverter delay chain coupled to the input inverter, wherein the first inverter delay chain receives the delayed inversion signal from the input inverter and provides a current-starved delay signal;
an output delay circuit having a second inverter delay chain arranged to operate as an output buffer that receives the current-starved delay signal from the first inverter delay chain and provides a delayed current-starved delay signal as an output signal; and
logic circuitry configured to generate the clock signal based on the output signal.

16. The integrated circuit of claim 15, wherein the second inverter delay chain includes an even number of inverters that are arranged to operate as an output buffer that receives the current-starved delay signal from the current-starved delay circuit and provides the delayed current-starved delay signal as the output signal.

17. An integrated circuit, comprising:
an input delay circuit having an input inverter that receives an input signal and provides a delayed inversion signal;
a current-starved delay circuit having a first inverter delay chain coupled to the input inverter, wherein the first inverter delay chain receives the delayed inversion signal from the input inverter and provides a current-starved delay signal; and
an output delay circuit having a second inverter delay chain arranged to operate as an output buffer that receives the current-starved delay signal from the first inverter delay chain and provides a delayed current-starved delay signal as an output signal;
wherein:
the first inverter delay chain includes a first inverter that receives the delayed inversion signal from the input inverter as a first inversion signal, receives a first supply voltage via a first pass transistor, generates a second inversion signal based on the first supply voltage, and provides the second inversion signal to a first node, and
the first pass transistor is coupled between the first supply voltage and a power supply connection of the first inverter, wherein the first pass transistor is activated with a voltage bias signal, and wherein the first pass transistor provides the first supply voltage to the power supply connection of the first inverter when activated.

18. The integrated circuit of claim 17, wherein:
the first inverter delay chain includes a second inverter that receives the second inversion signal from the first inverter via the first node, generates a third inversion signal based on the second inversion signal, and provides the third inversion signal to a second node, and
the first inverter delay chain includes a third inverter that receives the third inversion signal from the second inverter via the second node, generates a fourth inversion signal based on the third inversion signal, and provides the fourth inversion signal as the current-starved delay signal to the output delay circuit.

19. The integrated circuit of claim 17, further comprising:
a second pass transistor, a third pass transistor, and a capacitor coupled in series between the first supply voltage and a second supply voltage,
wherein the second pass transistor is coupled between the first supply voltage and the third pass transistor, and wherein the second pass transistor is activated based on the delayed inversion signal from the input inverter,
wherein the third pass transistor is coupled between the second pass transistor and the capacitor at the first node which is disposed between the first inverter and the second inverter, and wherein the third pass transistor operates as a keeper transistor that is activated by the third inversion signal as a feedback signal from the second inverter via the second node, and
wherein the capacitor is coupled between the third pass transistor at the first node and the second supply voltage.

20. A method, comprising:
fabricating a sense amplifier configured to operate with a clock signal;
fabricating input delay circuitry that receives an input signal and provides a delayed inversion signal;
fabricating current-starved delay circuitry as an inverter delay chain that receives the delayed inversion signal from the input delay circuitry and provides a current-starved delay signal based on the delayed inversion signal;
fabricating output buffer circuitry that receives the current-starved delay signal from the current-starved delay circuit and provides a delayed current-starved delay signal as an output signal; and
fabricating logic circuitry configured to generate the clock signal based on the output signal.

* * * * *